(12) United States Patent
Ho et al.

(10) Patent No.: US 8,456,906 B2
(45) Date of Patent: Jun. 4, 2013

(54) MEMORY AND OPERATION METHOD THEREFOR

(75) Inventors: Hsin-Yi Ho, Hsinchu (TW);
Chun-Hsiung Hung, Hsinchu (TW);
Yun-Chen Chou, Jhongli (TW)

(73) Assignee: Macronix International Co., Ltd., Hsinchu (TW)

( * ) Notice: Subject to any disclaimer, the term of this patent is extended or adjusted under 35 U.S.C. 154(b) by 22 days.

(21) Appl. No.: 13/306,678

(22) Filed: Nov. 29, 2011

(65) Prior Publication Data

US 2012/0069671 A1 Mar. 22, 2012

Related U.S. Application Data

(63) Continuation of application No. 12/576,323, filed on Oct. 9, 2009, now Pat. No. 8,094,494.

(51) Int. Cl.
*G11C 11/34* (2006.01)

(52) U.S. Cl.
USPC .................................. 365/185.03; 365/185.2

(58) Field of Classification Search
USPC .......................................... 365/185.03, 185.2
See application file for complete search history.

(56) References Cited

U.S. PATENT DOCUMENTS 5,067,111 A * 11/1991 Asano et al. ............. 365/189.08
5,675,538 A 10/1997 Park et al.

* cited by examiner

*Primary Examiner* — Son Dinh
*Assistant Examiner* — Nam Nguyen
(74) *Attorney, Agent, or Firm* — McClure, Qualey & Rodack, LLP

(57) ABSTRACT

An operation method for a memory device having a plurality of memory cells includes: reading the plurality of memory cells by a first word line voltage to get a first number of a first logic state; reading the plurality of memory cells by a second word line voltage to get a second number of the first logic state, the second word line voltage different from the first word line voltage; and using the second word line voltage as a target word line voltage if the first number of the first logic state is equal to the second number of the first logic state.

12 Claims, 10 Drawing Sheets

MEMORY AND OPERATION METHOD THEREFOR

This application is a continuation application of co-pending application Ser. No. 12/576,323, filed on Oct. 9, 2009, the contents of which are incorporated here by reference.

TECHNICAL FIELD

The invention relates in general to a memory and an operation method therefore.

BACKGROUND

In recent years, non-volatile memories that are data-rewritable semiconductor devices are widely used. Memory may be classified into various types including, for example, a SLC (single-level cell) memory and a MLC (multi-level cell) memory. In SLC memory, a single memory cell stores a single bit; while in MLC memory, a single memory cell may store multiple bits.

In memory reading, an output current is obtained by applying a word line reference voltage to a gate of the memory cell and applying a bit line voltage to source/drain of the memory cell. The output current is compared with a reference current to determine the logic state of the memory cell.

FIG. 1 shows a reading distribution of a SLC memory, wherein the X-axis presents a threshold voltage (Vt) and the Y-axis presents quantity of cells. A moving algorithm is used to obtain a proper word line reference voltage. After reading the memory having a plurality of memory cells, it is checked that read data is correct or not and how many bits are error in read. In checking whether the read data is correct or not and how many bits are error in read, reading results of a reading operation on the memory cells are compared with an original data.

If the total number of bit 1 in the reading results is less than the total number of bit 1 in the original data, then the moving algorithm moves up the word line reference voltage, as shown in FIG. 2A. On the contrary, if the total number of bit 1 in the reading results is larger than the total number of bit 1 in the original data, then the moving algorithm moves down the word line reference voltage, as shown in FIG. 2B. In FIG. 2A and FIG. 2B, WL1~WL3 refer to three different word line reference voltages.

After the word line reference voltage is moved, the reading operation on the memory cell and the error check operation are performed again. The movement of the word line reference voltage, the reading operation on the memory cell and the error check operation are repeated until the read data is correct.

However, there are some problems. Sometimes, the memory cells may have defect bits and tail bits and accordingly, the read distribution is divided into three distributions: main bits distribution, tail bits distribution and defect bits distribution, as shown in FIG. 3. Usually, almost memory cells are in main bits distribution. Some memory cells, which are tailed the main bits, are in tail bits distribution; and they may be caused by fast erasing, charge loss, charge gain and etc. Some memory cells, which are in the defect bits distribution, may be caused by process defects.

It is difficult in distinguishing defect bits and tail bits. If memory cells have both defect bits and tail bits, it needs more moving times in reading. FIG. 4 shows reading memory cells having both defect bits and tail bits in prior art. As shown in FIG. 4, in order to cover the defect bits (logic "0" for example), it needs to move the word line reference voltage 3 times (from WL1 to WL2, from WL2 to WL3 and from WL3 to WL4). Many word line reference voltage movements will lower reading speed. Further, the reading margin is small. In FIG. 4, RM 41 refers to reading margin in reading logic "1" while RM 43 refers to reading margin in reading logic "0".

Secondly, generally, there are a lot of word lines in a memory. Different word lines may have different read distribution. A page is a sub-block in the word line, i.e. a word line has a lot of pages. FIG. 5 shows reading different pages in the same word line by the prior art. As shown in FIG. 5, in reading P (0) (the first page in the word line), it needs three times in moving the word line reference voltage; and in reading P (1) or other page in the same word line, the word line reference voltage is moved from WL1 to WL2 for reading the tail bits. Therefore, it wastes a lot of time to move the word line reference voltage in different pages of the same word line.

Third, in prior art, read speed in reading MLC memory is also slow. In MLC memory, the main bit distribution is "11", "10", "01" and "00". Level 3 reading and level 1 reading are used in reading MLC low bit. Level 2 reading is used in reading MLC high bit. FIG. 6A shows reading a page in MLC memory array. As shown in FIG. 6A, it is assumed that there are both defect bits and tails bits in the "01" distribution in the page. In order to cover the both defect bits and tails bits in the "01" distribution, it may need 3 times in moving the word line reference voltage in level 3 reading. However, 3 times in moving the word line reference voltage in level 3 reading may cause not enough time in level 1 reading (if it needs 2 times in moving the word line reference voltage in level 1 reading). If the MLC memory reading is limited by read timing limit (read latency), it is preferred to waste as few moving times in level 3 reading and in level 1 reading as possible. But as shown in FIG. 6A, it wastes a lot of times in moving the word line reference voltage in level 3 reading and in level 1 reading. So the read speed in reading MLC memory is limited.

FIG. 6B shows reading pages P(0) and P(n) in MLC memory array, N being a natural number, P(0) being an initial page of a word line and P(N) being other page of the same word line. As shown in FIG. 6B, in reading the initial page P(0), it may need 3 times in moving the word line reference voltage in level 3 reading and 2 times in moving the word line reference voltage in level 1 reading, respectively; and in reading page P(N), it may still need 3 times in moving the word line reference voltage in level 3 reading and 2 times in moving the word line reference voltage in level 1 reading, respectively. Therefore, it needs a lot of moving times.

BRIEF SUMMARY

Embodiments of an operation method for memory and a memory using the same are provided. The embodiments of the invention provide a moving algorithm which distinguishes defect bits and tail bits. Further, the moving algorithm in the embodiments has a function of learning word line reference voltage.

In embodiments of the invention, error bit numbers in each read are recorded. Before moving the word line reference voltage, error bit numbers of last reading and of current reading are compared to decide whether to stop moving or not. By this stop moving mechanics, the embodiments can distinguish defect bits and tail bits. Defect bits not covered yet is corrected (or covered) by correction algorithm for example but not limited, ECC (Error Checking and Correcting).

An exemplary embodiment of an operation method for a memory device including a plurality of memory cells is provided. The operation method includes: reading the plurality of memory cells by a first word line voltage to get a first number of a first logic state; reading the plurality of memory cells by a second word line voltage to get a second number of the first logic state, the second word line voltage different from the first word line voltage; and using the second word line voltage as a target word line voltage if the first number of the first logic state is equal to the second number of the first logic state.

An embodiment of a memory device is provided. The memory device includes: a memory array including a plurality of memory cells; and a read control circuit, coupled to the memory array, the read control circuit controlling reading operation on the memory array. Under control of the read control circuit, the memory array is read by a first word line voltage to get a first number of a first logic state. Under control of the read control circuit, the memory array is read by a second word line voltage to get a second number of a first logic state, the second word line voltage different from the first word line voltage. The read control circuit uses the second word line voltage as a target word line voltage if the read control circuit checks that the first number of the first logic state is equal to the second number of the first logic state.

It is to be understood that both the foregoing general description and the following detailed description are exemplary and explanatory only and are not restrictive of the disclosed embodiments, as claimed.

DETAILED DESCRIPTION OF EXEMPLARY EMBODIMENT OF THE INVENTION

First Embodiment

Figure 7A:
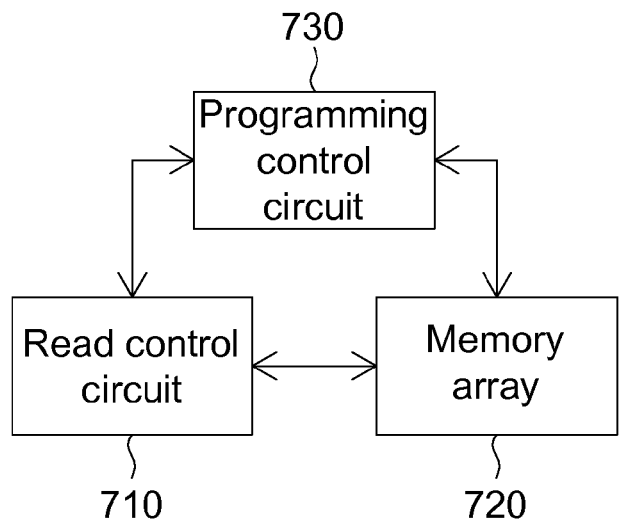
FIG. 7A shows a block diagram of a memory device of a first embodiment.

Referring to FIG. 7A, a block diagram of a memory device 700 of a first embodiment is shown. The memory device 700 includes a read control circuit 710, a memory array 720 and a programming control circuit 730. The memory array 720 includes a lot of memory cells. The memory cells may be SLC (single level cell) or MLC (multi-level cell).

Figure 7B:
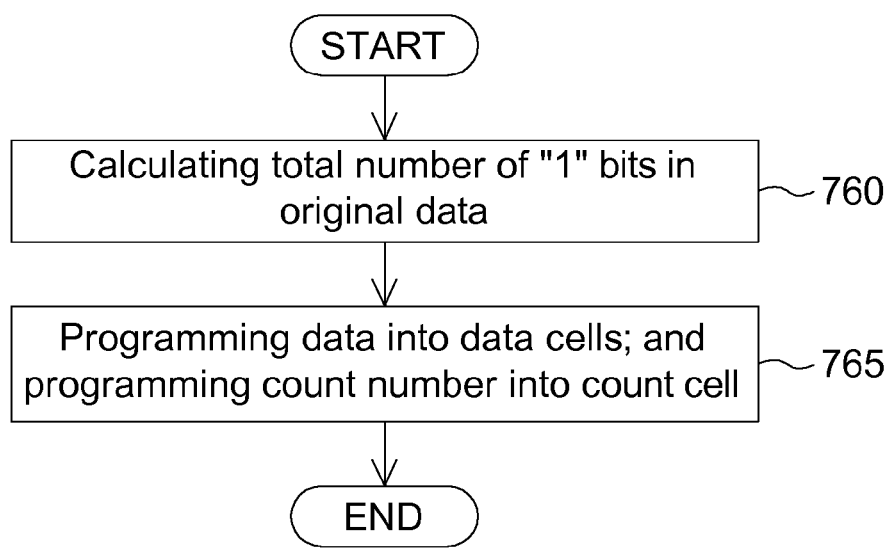
FIG. 7B shows a programming flow according to the first embodiment of the invention.

FIG. 7B shows a programming flow according to the first embodiment of the invention, which is performed by the programming control circuit 730. As shown in FIG. 7B, before programming, the programming control circuit 730 calculates total number of "1" bits in data to be programmed (i.e. the original data), as shown in step 760. Then, the programming control circuit 730 programs the original data into data cells; and also, the programming control circuit 730 programs the count number into count cells, as shown in step 765. The term "data cell" refers to the memory cell which is used for storing the original data; and the term "count cell" refers to the memory cell which is used for storing the count number. The count number refers to the total number of "1" bits in the original data.

Figure 8:
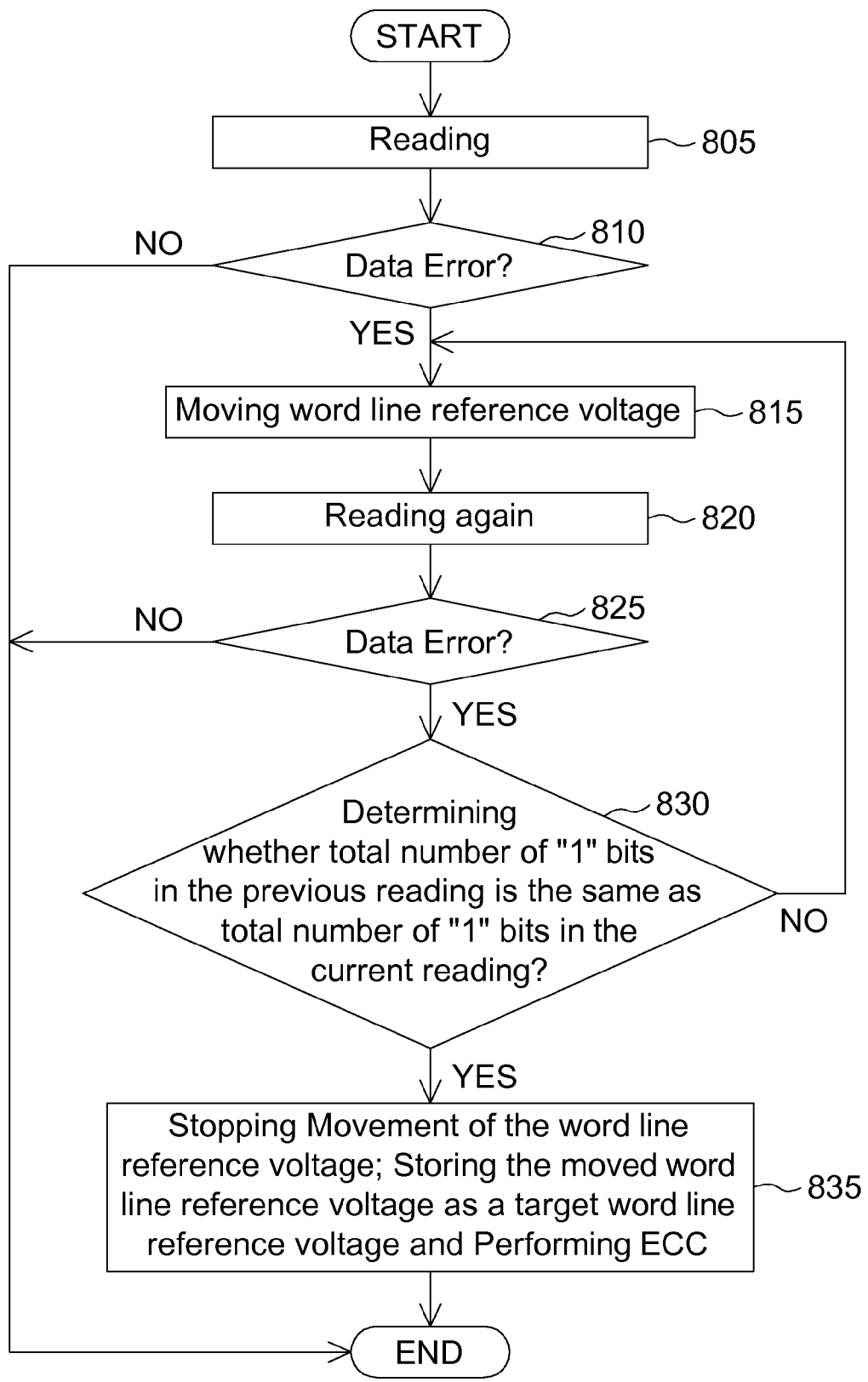
FIG. 8 shows a flow chart of an operation method applied in the memory device according to the first embodiment of the invention.
Figure 9A:
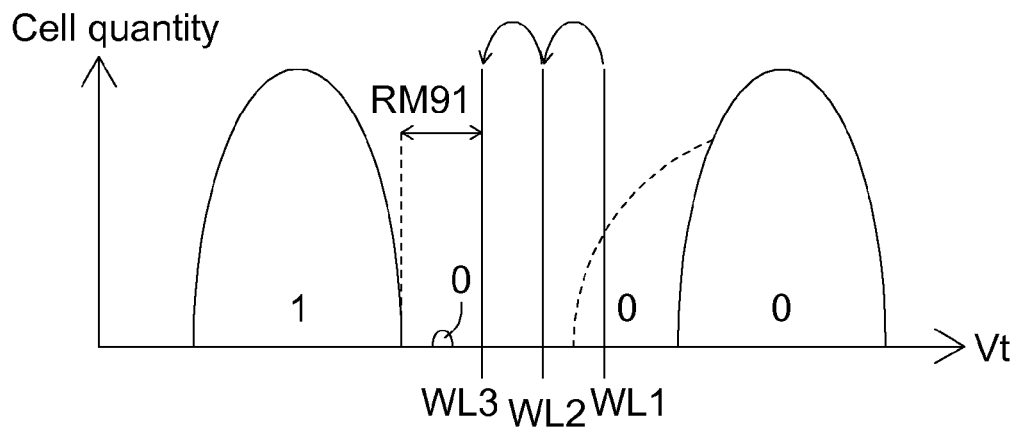
FIG. 9A shows the moving algorithm (moving down the word line reference voltage) according to the first embodiment of the invention.

Operations of the memory device during data reading are described in details as follows. FIG. 8 shows a flow chart of an operation method applied in the memory device 700 according to the first embodiment of the invention, which is performed by the read control circuit 710. FIG. 9A shows the moving algorithm (moving down the word line reference voltage) according to the first embodiment of the invention; and FIG. 9B shows the moving algorithm (moving up the word line reference voltage) according to the first embodiment of the invention.

Figure 9B:
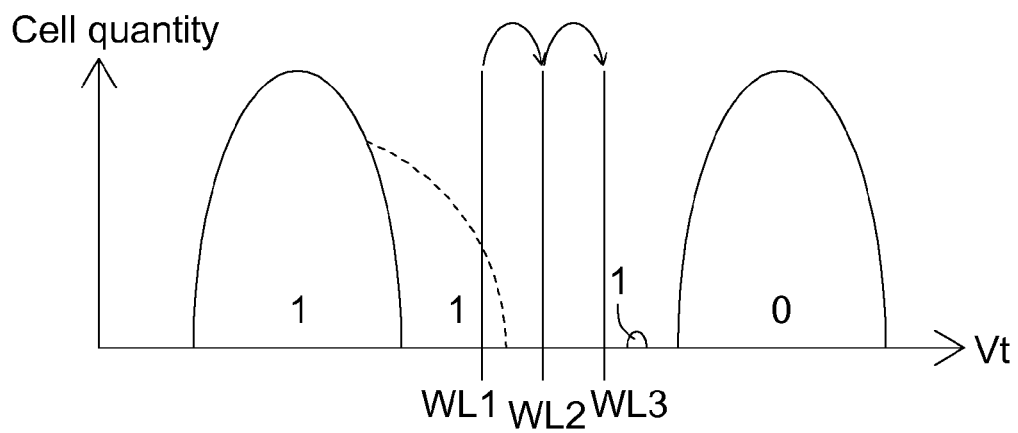
FIG. 9B shows the moving algorithm (moving up the word line reference voltage) according to the first embodiment of the invention.

As shown in FIG. 8, in step 805, the memory device 700 is read, for example, by applying a word line reference voltage WL1 in FIG. 9A or 9B to read a page, wherein the memory device 700 includes a plurality of word lines each including a plurality of pages each including a plurality of bits. In step 810, it is check whether data read in step 805 is error or not by for example, checking if total number of logic "1" bits in the reading is correct or not. If data read is not error, then the reading flow is end, and the current word line reference voltage WL1 is stored as a target word line reference voltage. The target word line reference voltage refers to that, in following readings, the memory device is read by applying the target word line reference voltage. On the contrary, if data read is error, then the word line reference voltage WL1 is moved. If the total number of logic "1" bits in the data read is more than the total number of logic "1" bits in the original data, then the word line reference voltage WL1 is moved down as the word line reference voltage WL2, as shown in FIG. 9A. If the total number of logic "1" bits in the data read is fewer than the total number of logic "1" bits in the original data, then the word line reference voltage WL1 is moved up as the word line reference voltage WL2, as shown in FIG. 9B.

Then, in step 820, the memory device is read by applying the word line reference voltage WL2; and in step 825, it is check whether data read in step 820 is error or not. If data read is not error, then the reading flow is end, and the current word line reference voltage (WL2) is stored as the target word line reference voltage. If data read is error, then in step 830, data read in step 805 (by applying the word line reference voltage WL1) and data read in step 820 (by applying the word line reference voltage WL2) are compared, as shown in step 830.

In step 830, it is determined that whether the total number of logic "1" bits in the data read in step 805 (by applying the word line reference voltage WL1) is the same as the total number of logic "1" bits in the data read in step 820 (by applying the word line reference voltage WL2). If they are the same, then the flow jumps to step 835; and if they are not the same, then the flow returns to step 815.

The total number of logic "1" bits in the previous data reading and the total number of logic "1" bits in the current data reading are both calculated and programmed into the count cells by the programming control circuit 730. The read control circuit 710 requests the programming control circuit 730 to output the total number of logic "1" bits in the previous data reading and the total number of logic "1" bits in the current data reading. For simplicity, programming the total number of logic "1" bits in the previous data reading and the total number of logic "1" bits in the current data reading into the count cells is enough. Of course, the count number of the original data is remained in the count cell unless the original data is overwritten by new data. Taking FIG. 9A as an example, the total number of logic "1" bits in the data read by applying the word line reference voltage WL2 and the total number of logic "1" bits in the data read by applying the word line reference voltage WL3 are programmed into the count cells while the total number of logic "1" bits in the data read by applying the word line reference voltage WL1 is discarded.

In step 835, the step of moving the word line reference voltage is stopped; the current word line reference voltage is stored as the target word line reference voltage; and the defect bits in the memory cells are covered by ECC. The following description explains the reason in the step 835.

If the total number of logic "1" bits in the previous read data is different from the total number of logic "1" bits in the currently read data, it means that at least one of the previous word line reference voltage and the current word line reference voltage covers (or is located in) the tail bit distribution. For example, as shown in FIGS. 9A and 9B, the total number of logic "1" bits in the previous read data by applying the word line reference voltage WL1 is different from the total number of logic "1" bits in the currently read data by applying the word line reference voltage WL2 because the word line reference voltage WL1 covers (or is located in) the tail bit distribution.

On the contrary, if the total number of logic "1" bits in the previous read data is same the total number of logic "1" bits in the currently read data, it means that both the previous word line reference voltage and the current word line reference voltage already cover the tail bits. For example, as shown in FIGS. 9A and 9B, the total number of logic "1" bits in the previous read data by applying the word line reference voltage WL2 is the same as the total number of logic "1" bits in the currently read data by applying the word line reference voltage WL3 because both the word line reference voltages WL2 and WL3 cover the tail bits.

In the first embodiment, the word line reference voltage for a word line may be obtained based on respective word line reference voltages for respective pages of the same word line.

Figure 1:
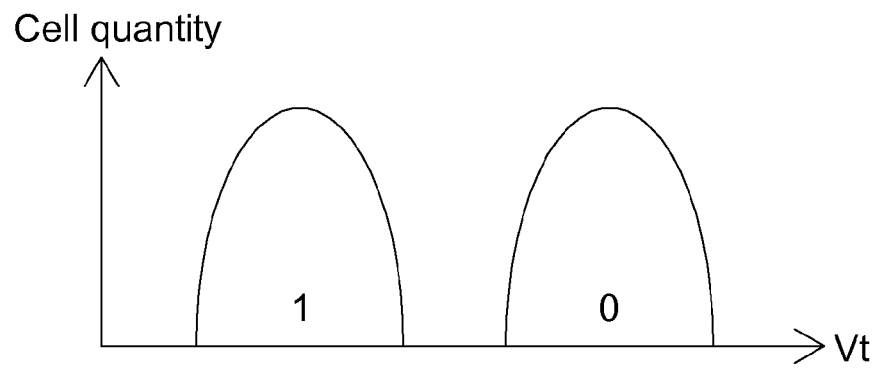
FIG. 1 shows a reading distribution of a SLC memory.
Figure 2A:
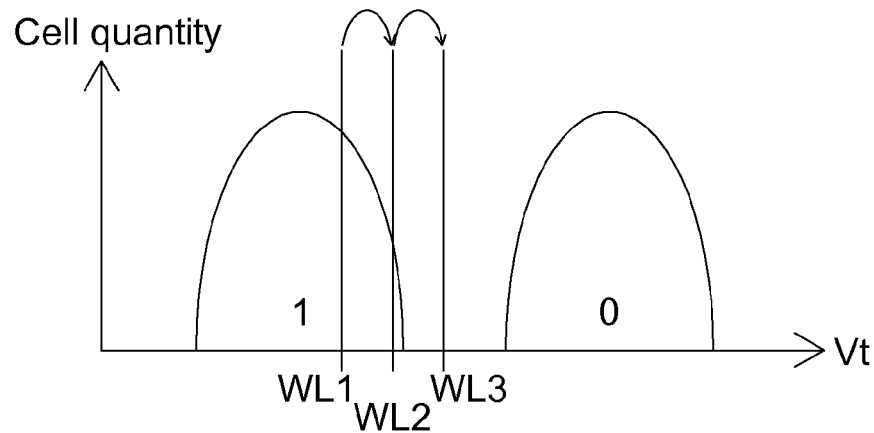
FIGS. 2A and 2B (prior art) show movement of the word line reference voltage.
Figure 2B:
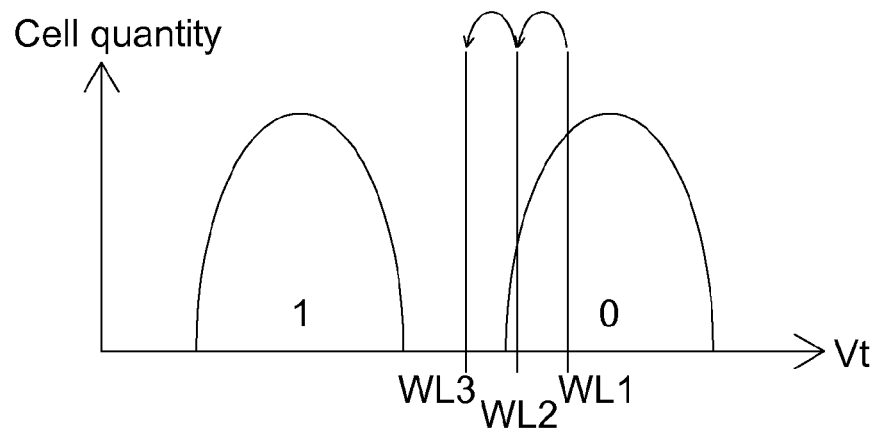
Figure 3:
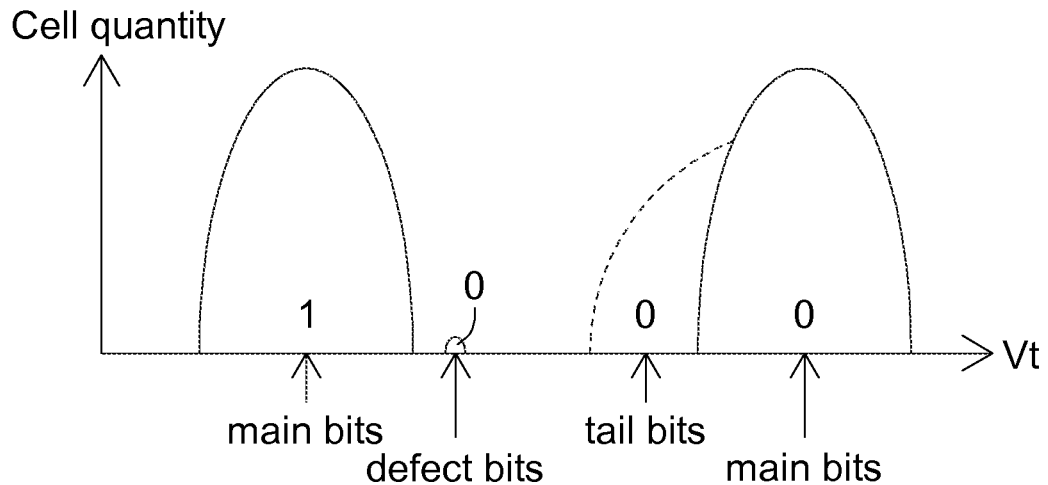
FIG. 3 shows the read distribution including: main bits distribution, tail bits distribution and defect bits distribution.
Figure 4:
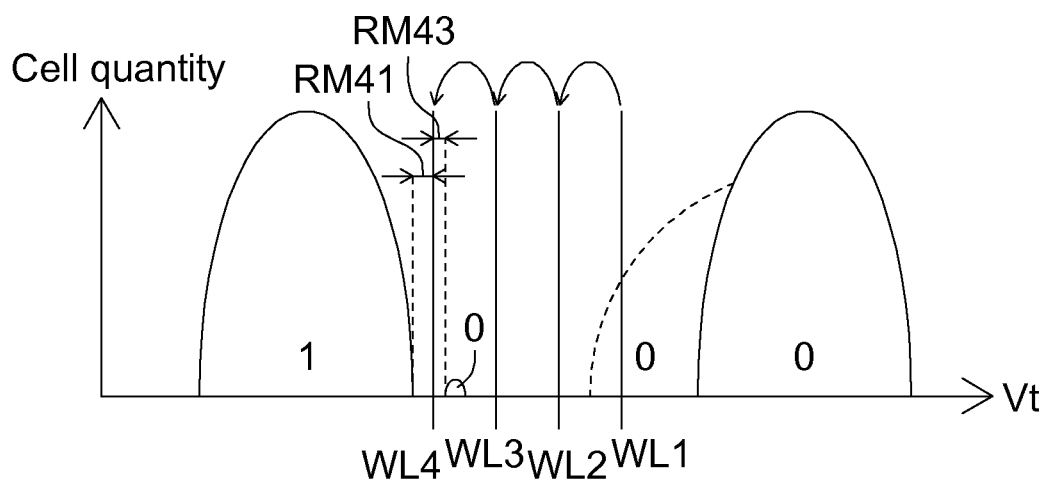
FIG. 4 (prior art) shows reading memory cells having both defect bits and tail bits in prior art.

In this embodiment, the tail bits (if any) are covered by moving the word line reference voltage, but the defect bits (if any) are covered by ECC. So, the total time taken in moving the word line reference voltage is reduced because the movement times in moving the word line reference voltage is fewer. Please refer to FIG. 4 and FIG. 9A. In FIG. 4 (PRIOR ART), it needs 4 times in moving word line reference voltage to cover the tail bits and the defect bits; but in FIG. 9A (the first embodiment of the application), it just needs 3 times in moving word line reference voltage to cover the tail bits (the defect bits will be covered by ECC).

Further, the reading margin in the first embodiment of the application is wider than the reading margin in the prior art. Please refer to FIG. 4 and FIG. 9A again. The reading margin RM 91 in reading logic "1" in FIG. 9A (the first embodiment of the application) is wider than the reading margin RM 41 in reading logic "1" in FIG. 4 (PRIOR ART).

Figure 6A:
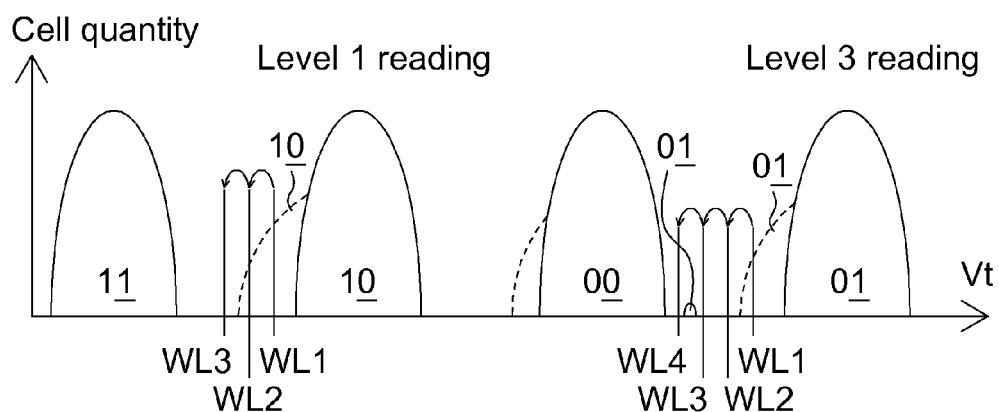
FIG. 6A (prior art) shows reading a page in MLC memory array in the prior art.
Figure 10:
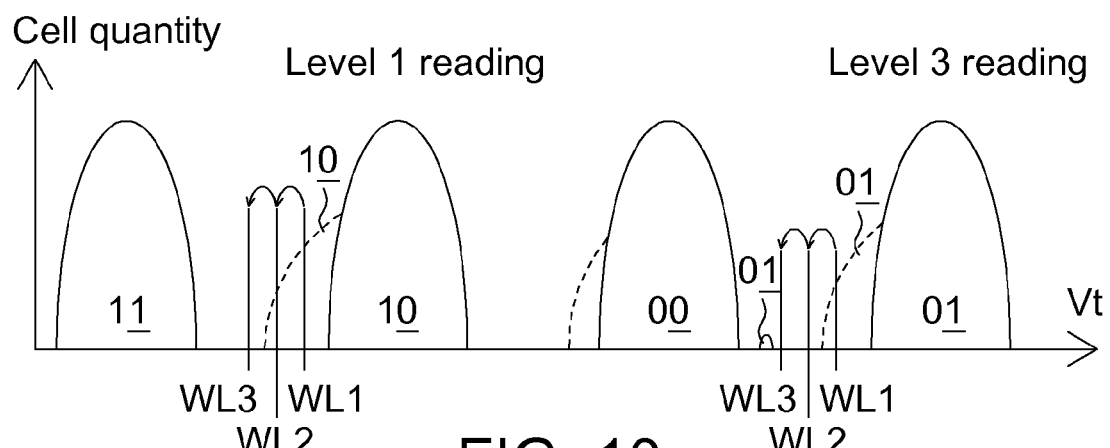
FIG. 10 shows the movement of the word line reference voltage according to the first embodiment of the application applied in MLC memory cells.

The first embodiment of the application is also applicable in MLC memory cells. FIG. 10 shows the movement of the word line reference voltage according to the first embodiment of the application applied in MLC memory cells. The flow chart in FIG. 8 is also applicable in determining the word line reference voltage in Level 2 reading, in Level 3 reading and in Level 1 reading. Level 2 reading refers to reading high bit in one page of the memory array. Level 3 reading refers to reading low bit when high bit is logic "0"; and Level 1 reading refers to reading low bit when high bit is logic "1". Please refer to FIG. 6A and FIG. 10 again. As shown in FIG. 6A (PRIOR ART), it needs 5 times in moving word line reference voltage to cover the tail bits and the defect bits (three times in moving the word line reference voltage in level 3 reading and two times in moving the word line reference voltage in level 1 reading); but in FIG. 10 (the first embodiment of the application), it needs 4 times in moving word line reference voltage to cover the tail bits (the defect bits will be covered by ECC), wherein two times in moving the word line reference voltage in level 3 reading and two times in moving the word line reference voltage in level 1 reading. Further, the reading margin in the first embodiment of the application is wider than the reading margin in the prior art.

In brief, in the first embodiment of the application, the movement of the word line reference voltage is stopped if the total number of logic "1" bits in the previous reading and that in the current reading are the same. So, the time taken in moving the word line reference voltage is reduced (which means the reading speed is improved); and the reading margin is wide. In other words, in the first embodiment, the moving algorithm can distinguish the defect bits and the tail bits. In detail, in case of previous read data and current read data are both error, it is determined that there are defect bits if the total number of logic "1" bits in the previous read data is the same as the total number of logic "1" bits in the currently read data. On the contrary, the prior moving algorithm cannot distinguish defect bits, and the defect bits are covered by unnecessary moving times in moving the word line reference voltage.

The reading (operation) method and the memory array applying the same disclosed in the above first embodiment have many advantages exemplified below. In the first embodiment, unnecessary moving times are reduced, by stopping the step of moving the word line reference if the total number of logic "1" bits in the previous reading and the total number of logic "1" bits in the current reading are the same. Still further, in the first embodiment, large read margin, good endurance and good retention are obtained because unnecessary movement of the word line reference voltage is prevented. Further, in the first embodiment, reading speed is improved because unnecessary moving times are further reduced.

Second Embodiment

In the second embodiment, the disclosure about moving and stopping moving the word line reference voltage is substantially the same as that in the first embodiment. In the second embodiment, a learning function is further disclosed.

Figure 11:
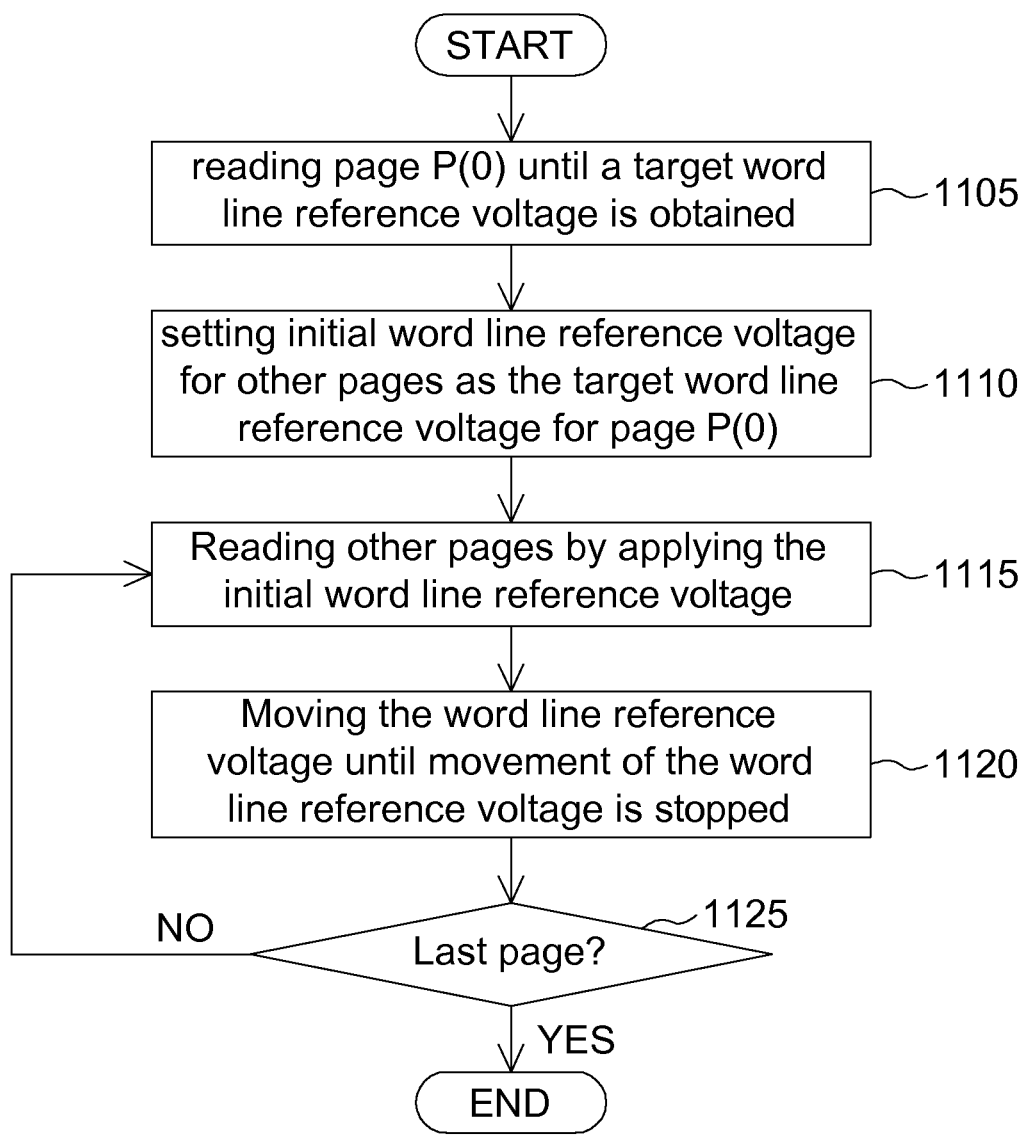
FIG. 11 shows a flow chart according to the second embodiment of the application.

FIG. 11 shows a flow chart according to the second embodiment of the application. As shown in FIG. 11, in step 1105, an initial page P(0) of the memory array is read by applying and moving the word line reference voltage until the target word line reference voltage is obtained. The details of the step 1105 is substantially the same as the steps 810~835 of FIG. 8.

Figure 12:
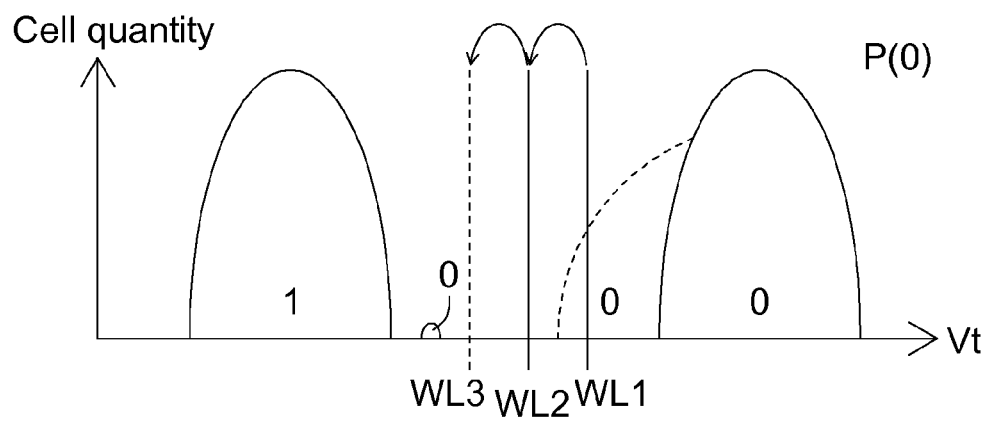
FIG. 12 shows learning the initial word line reference voltage for other pages from the target word line reference voltage for the initial page of the same word line, according to the second embodiment of the application.
Figure 12:
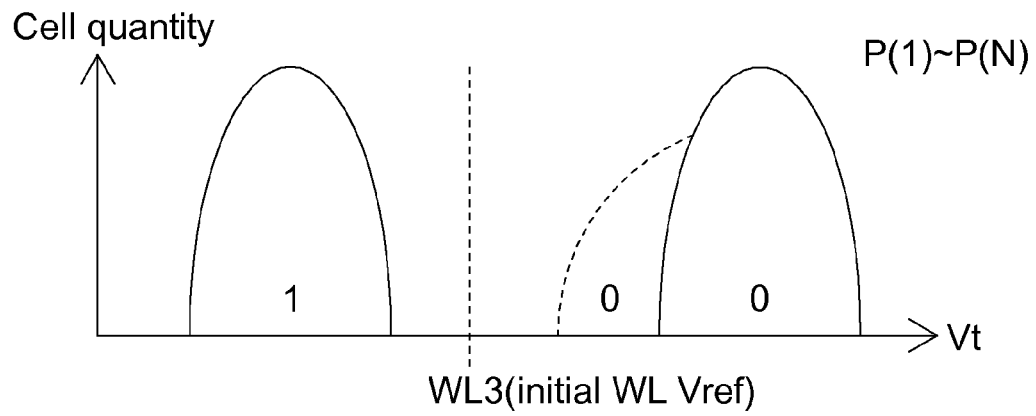

Then, in step 1110, the target word line reference voltage obtained in reading the initial page P(0) is learned to all other pages P(1)~P(N) in the memory array, N as a natural number. In other words, respective initial word line reference voltage for other pages is set as the target word line reference voltage for the initial page P(0). The meaning of "learning" is shown in FIG. 12, which will be described in detail later. Then, in step 1115, other pages are read applying the initial word line reference voltage after learning.

Then, in step 1120, if necessary, for respective other pages, the word line reference voltage is moved up or down from the initial word line reference voltage until moving of the word line reference voltage is stopped (or said, until respective target word line reference voltage for other pages is obtained) as in the first embodiment. Then, in step 1125, it is determined whether the last page of the word line is read or not. If yes, then the reading on the word line is end; or the flow returns to the step 1115.

Now, how to learn the word line reference voltage in the second embodiment is described. FIG. 12 shows learning of the initial word line reference voltage for other pages from the target word line reference voltage for the initial page of the same word line, according to the second embodiment of the application. In FIG. 12, it is assumed that the target word line reference voltage obtained in reading page P(0) is WL3. By learning, initial word line reference voltage for all other pages P(1)~P(N) will be set as WL3, rather than WL1. In other words, in reading all other pages P(1)~P(n), if it is necessary in moving the word line reference voltage, the word line reference voltage is moved up or down directly from WL3, rather than from WL1. As seen from FIG. 12, if pages P(1)~P(N) have the reading distribution as shown in FIG. 12, then in reading pages P(1)~P(N), it would be 0 time in moving the word line reference voltage.

Figure 5:
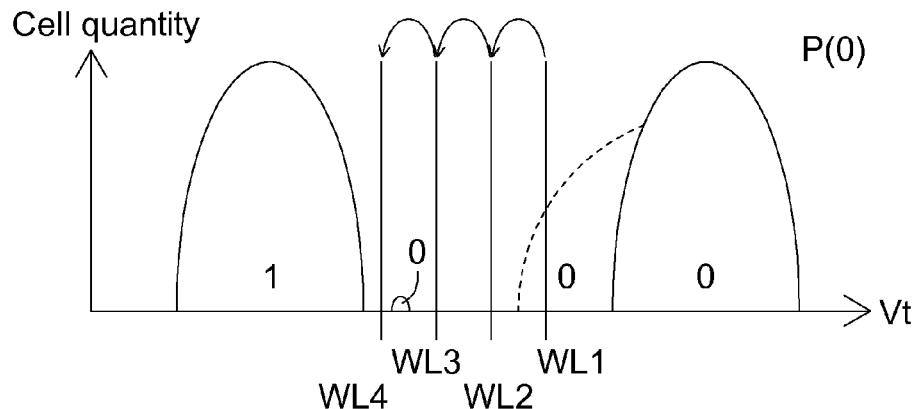
FIG. 5 (prior art) shows reading different pages of the same word line in SLC memory array in the prior art.
Figure 5:
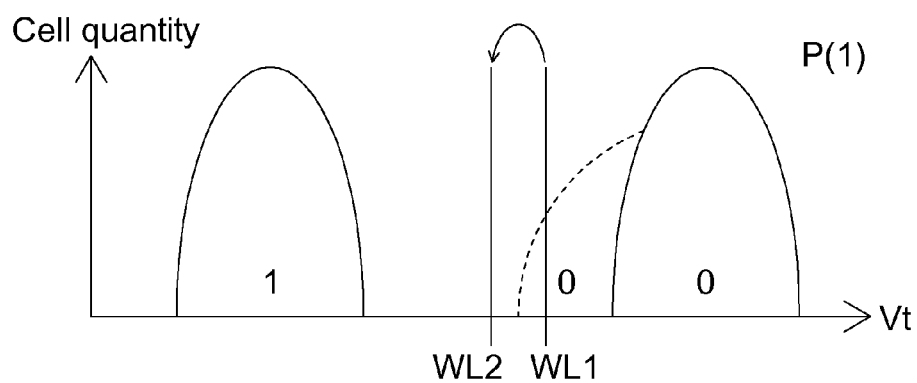

In the second embodiment, moving times for other pages P(1)~P(n) may be further reduced. Please refer to FIGS. 5 and 12. In FIG. 5 (PRIOR ART), it needs 3 times in moving the word line reference voltage in reading page P(0) and 1 time in moving the word line reference voltage in reading page P(1), so it needs 4 times in total in moving the word line reference voltage in reading P(0) and P(1). In FIG. 12, it needs 2 times in moving the word line reference voltage in reading page P(0) (due to stop of moving the word line reference voltage stop in the first embodiment) and 0 time in moving the word line reference voltage in reading page P(1) (because of the learning function), so it needs 2 times in total in moving the word line reference voltage in reading P(0) and P(1).

Figure 13:
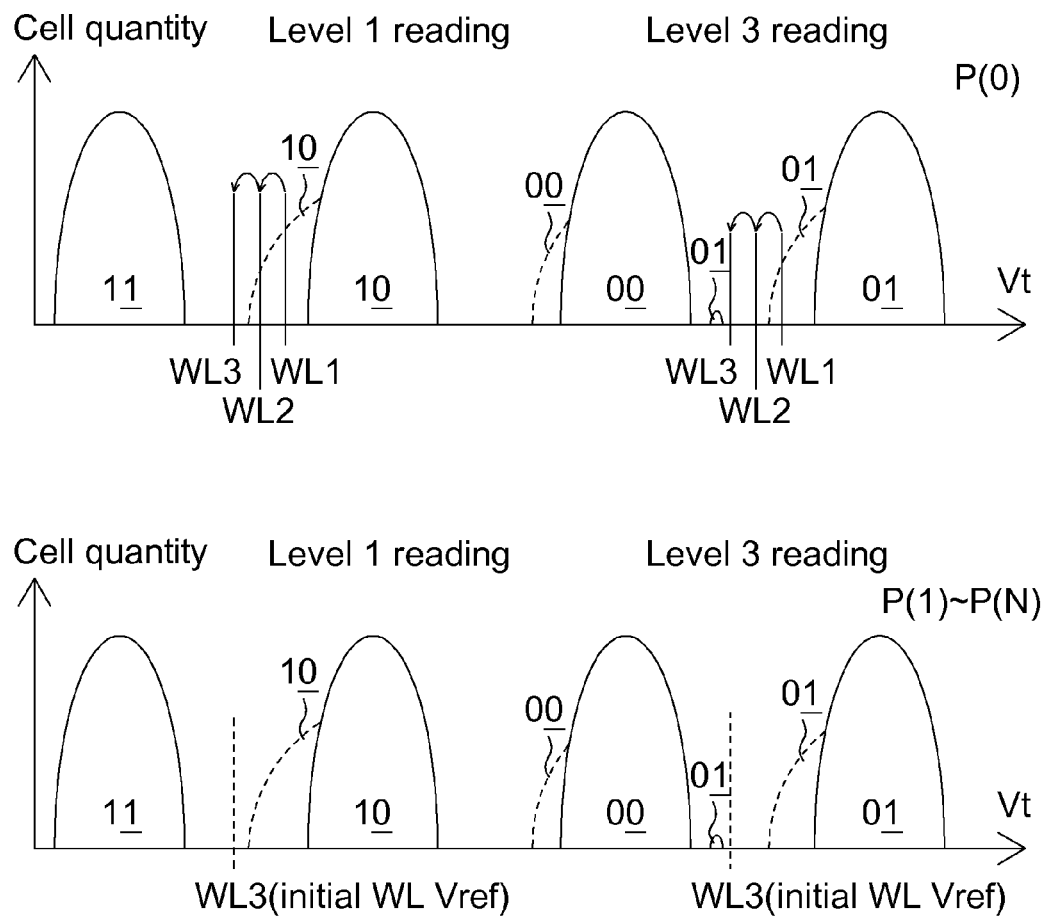
FIG. 13 shows reading MLC memory array according to the second embodiment.

The second embodiment is also applicable in MLC memory array. FIG. 13 shows reading MLC memory array according to the second embodiment. By learning, initial word line reference voltage for all other pages P(1)~P(N) will be set as WL3, rather than WL1. In other words, in reading all other pages P(1)~P(n), if it is necessary in moving the word line reference voltage, the word line reference voltage is moved up or down from WL3, rather than from WL1. Further, if pages P(1)~P(N) have the reading distribution as shown in FIG. 13, then in reading pages P(1)~P(N), it would be 0 time in moving the word line reference voltage in both level 3 reading and in level 1 reading.

Figure 6B:
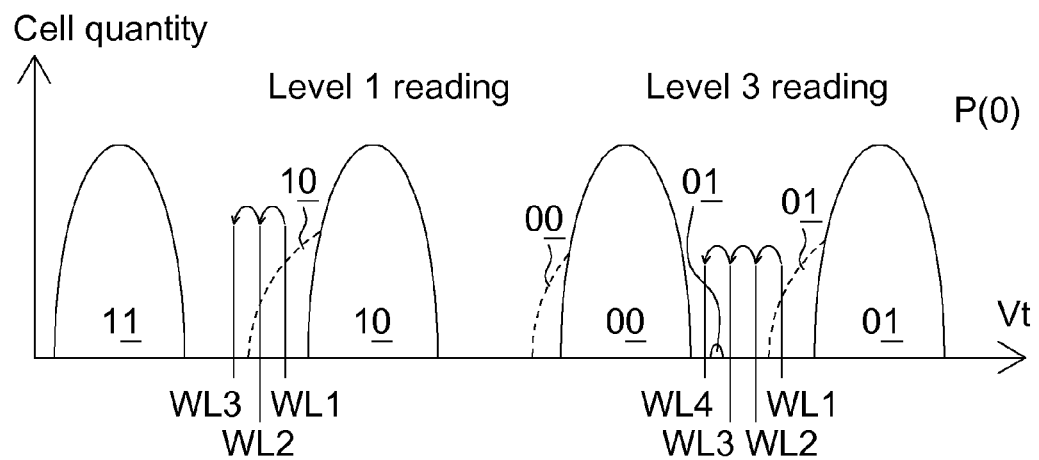
FIG. 6B (prior art) shows reading pages in the same word line in MLC memory array in the prior art.
Figure 6B:
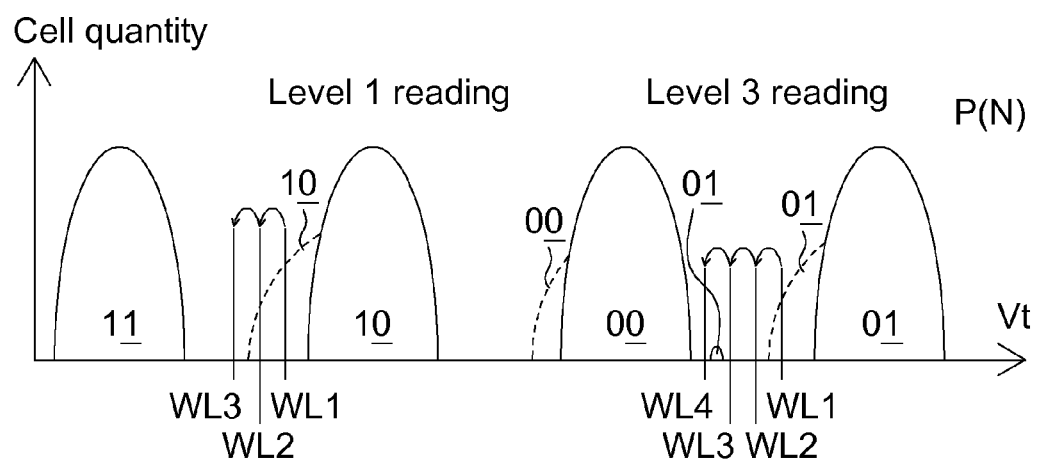

Please refer to FIG. 13 and FIG. 6B again. In FIG. 6B, in reading page P(1), it needs 3 times to move the word line reference voltage in level 3 reading and 2 times to move the word line reference voltage in level 1 reading, respectively; but in FIG. 13, in reading page P(1), by learning (i.e. by setting initial word line reference voltage as WL 3), it may be 0 time in moving the word line reference voltage in level 3 reading and 0 time to move the word line reference voltage in level 1 reading, respectively. So, the times in moving the word line reference voltage is fewer than in the prior art.

Although not shown in the drawings, it is concluded that the second embodiment is also applicable in learning the word line reference voltage in level 2 reading.

The reason for learning relies on that, in general, all pages in the same word line may have similar read distribution. In other words, respective final word line reference voltage for all pages in the same word line would be almost close to each other. So, by learning, the final (or the target) word line reference voltage for the initial page is set as the initial reference voltage for other pages of the same word line and accordingly, the times in moving the word line reference voltage for other pages would be further reduced.

The reading (operation) method and the memory array applying the same disclosed in the second embodiment have many advantages exemplified below. In the second embodiment, unnecessary moving times are reduced, by stopping the step of moving the word line reference if the total number of logic "1" bits in the previous reading and the total number of logic "1" bits in the current reading are the same. Still further, in the second embodiment, large read margin, good endurance and good retention are obtained because unnecessary movement of the word line reference voltage is prevented. Further, in the second embodiment, reading speed is improved because unnecessary moving times are further reduced. Further, in the second embodiment, unnecessary moving times are further reduced, by learning the initial word line reference for other pages from the target word line reference for the initial page of the same word line.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. An operation method of a memory device including a plurality of memory cells, comprising:
    reading the plurality of memory cells by a first word line voltage to get a first number of a first logic state;
    reading the plurality of memory cells by a second word line voltage to get a second number of the first logic state, the second word line voltage different from the first word line voltage; and
    using the second word line voltage as a target word line voltage if the first number of the first logic state is equal to the second number of the first logic state.

2. The operation method according to claim 1, wherein the step of reading the plurality of memory cells by the second word line voltage is performed after the step of reading the plurality of memory cells by the first word line voltage.

3. The operation method according to claim 1, further comprising:
    moving the first word line voltage as the second word line voltage if the first number of the first logic state is not correct.

4. The operation method according to claim 3, further comprising:
  moving down the first word line voltage if the first number of the first logic state is more than a number of the first logic state in an original data; and
  moving up the first word line voltage if the first number of the first logic state is fewer than the number of the first logic state in the original data.

5. The operation method according to claim 1, further comprising:
  moving the second word line voltage if the first number of the first logic state is different from the second number of the first logic state.

6. The operation method according to claim 1, wherein the memory device including a plurality of pages and the operation method further comprises:
  using respective first word line voltage for other pages as a respective target word line voltage for an initial page.

7. A memory device including:
  a memory array including a plurality of memory cells;
  a read control circuit, coupled to the memory array, the read control circuit controlling reading operation on the memory array;
  wherein
  under control of the read control circuit, the memory array is read by a first word line voltage to get a first number of a first logic state;
  under control of the read control circuit, the memory array is read by a second word line voltage to get a second number of a first logic state, the second word line voltage different from the first word line voltage; and
  the read control circuit uses the second word line voltage as a target word line voltage if the read control circuit checks that the first number of the first logic state is equal to the second number of the first logic state.

8. The memory device according to claim 7, wherein under control of the read control circuit, the memory array read by the second word line voltage is performed after the memory array read by the first word line voltage.

9. The memory device according to claim 7, wherein:
  the read control circuit moves the first word line voltage as the second word line voltage if the read control circuit checks that the first number of the first logic state is not correct.

10. The memory device according to claim 9, wherein:
  the read control circuit moves down the first word line voltage if the read control circuit checks that the first number of the first logic state is more than a number of the first logic state in an original data; and
  the read control circuit moves up the first word line voltage if the read control circuit checks that the first number of the first logic state is fewer than the number of the first logic state in the original data.

11. The memory device according to claim 7, wherein:
  the read control circuit moves the second word line voltage if the read control circuit checks that the first number of the first logic state is different from the second number of the first logic state.

12. The memory device according to claim 7, wherein:
  the memory device including a plurality of pages; and
  the read control circuit uses respective first word line voltage for other pages as a respective target word line voltage for an initial page.

* * * * *